United States Patent [19]

Southard

[11] Patent Number: 4,829,521
[45] Date of Patent: May 9, 1989

[54] TEST CIRCUIT FOR DETECTING SHORT DURATION PULSES

[75] Inventor: Robert D. Southard, Chesapeake, Va.

[73] Assignee: The United States of America as represented by the Secretary of the Navy, Washington, D.C.

[21] Appl. No.: 95,080

[22] Filed: Sep. 11, 1987

[51] Int. Cl.[4] ............................................. G01R 31/28
[52] U.S. Cl. .................................. 371/20; 324/73 R
[58] Field of Search ................ 307/267, 268; 328/111, 328/112; 371/15, 20, 23, 25; 324/73 R, 73 AT, 73 PC

[56] References Cited

U.S. PATENT DOCUMENTS 4,216,539  8/1980  Raymond et al. ................ 324/73 R

OTHER PUBLICATIONS

"Designer's Casebook", by Raghavan, pp. 93 and 94 of *Electronics*, Jan. 6, 1969.
"Logic Analyzer Catches 5-ns Spikes", by Santoni, p. 142 of *Electronics*, Feb. 19, 1976.

*Primary Examiner*—A. D. Pellinen
*Assistant Examiner*—Geoffrey S. Evans
*Attorney, Agent, or Firm*—William C. Townsend; Alan P. Klein; Edward J. Connors, Jr.

[57] ABSTRACT

A test assembly for automatically testing and diagnosing digital printed-circuit boards has a driver circuit for supplying a stimulus pulse to the circuit board to be tested, a sensor circuit for detecting the output from the circuit board in response to the stimulus pulse, a program for directing the testing operation of the test assembly, an input device such as a keyboard for entering instructions including the program to the test assembly, and an output device such as a printer for displaying the results of the test operation. The test assembly also includes a sense and hold circuit interconnected with the driver circuit, the sensor circuit and the circuit board, which senses the output pulses from the circuit board in response to the stimulus pulse, and provides an input pulse to the sensor circuit having a period greater than the minimum duration period capable of being detected by the sensor circuit.

12 Claims, 3 Drawing Sheets

TEST CIRCUIT FOR DETECTING SHORT DURATION PULSES

This invention relates to testing assemblies and more particularly to electronic testing devices which employ the static-functional method of testing printed circuit boards having logic circuits mounted thereon.

As the amount of electronic equipment employing digital printed circuit boards and requiring a very high degree of reliability such as in military applications and in computer, aerospace and similar applications, increases the desirability of testing on-site has grown. Such on-site testing, which supplements the testing at large scale facilities at the manufacturer's site, typically employs portable devices and technician level operators. By the term on-site is meant at the site where the equipment is actually employed such as a ship, aircraft, or computer facility, or at a local or regional repair depot where periodic maintenance is performed. Such on-site testing permits the quick replacement of printed circuit boards found defective with resultant low down time for the equipment under test.

In operation, such testing assemblies provide an input signal to a logic circuit having one or more gates and read the output signal from the logic circuit to determine if the signal predicted by the design of the logic circuit is actually produced at the output. In the static-functional method of testing a logic circuit, a series of different combinations of pulses representing different logic states is applied to the input of the logic circuit under test and the responses obtained at the output are compared with the output predicted by the truth table for the logic circuit under test. Although the number of different logic statements consisting of combinations of logic states in a complete truth table for a given logic circuit is $2^n$ where n is the number of inputs to the logic circuit, in practice, significantly fewer statements need to be tested by input to a logic circuit under test in order to insure correct operation of a logic circuit. The static-functional method of testing logic circuits assumes that most failures are catastrophic in nature and thus the static-functional method tests for this type of failure to permit quick replacement of defective printed circuit boards.

In order to permit such test assemblies to function on site, it is desirable that they be portable, capable of operation by technical level operators, and be capable of testing a wide varity of electronic devices. Such test units typically possess a programming capability to permit designating a particular test program to fit a particular test application. The above noted features have imposed certain limitations on the capabilities of such test assemblies. One such limitation is an inability to detect pulses below a certain width or duration. A number of test applications require detecting pulses of short duration falling below the threshold pulse width of the test assembly. The present invention provides a solution to this problem by providing an additional circuit which can be incorporated in a test assembly or be employed as a separate unit such as a printed circuit board which can be used with the test assembly by plugging it into the testing fixture holding the unit under test.

The present invention expands the capabilities of existing circuit test assemblies in order to avoid the expense of disassembling and forwarding the unit under test to a large scale test facility for further testing, thereby incurring extensive down time for the unit under test.

A portable test assembly with which the present invention is to be employed includes a driver circuit for supplying a stimulus pulse to the circuit element to be tested, a sensor circuit for detecting the output from the element under test and a printer or display for displaying the results of the test operation.

The present invention provides a sense and hold circuit to be incorporated as part of the test assembly or employed in conjunction therewith. The sense and hold circuit is connected to the driver circuit, the sensor circuit and the element under test and has first and second monostable multivibrators for detecting the output pulse from the circuit element under test and, in response to the pulse detected, for supplying a signal to the sensor circuit which is above the threshold width of signals acceptable by the sensor circuit. This is accomplished by selecting the values of the resistance and capacitance making up the RC time constants of the monostable multivibrators so that the signal supplied to the sensor circuit exceeds the threshold requirement of the sensor circuits.

It can be seen that the objects of this invention include providing a digital circuit testing assembly which is portable, capable of operation by technical level operators in field or on-site locations and which is capable of testing a wide variety of printed circuit boards and components, and which includes the capability of testing circuit elements operating on pulses of very short duration.

Other objects and advantages of the present invention will become apparent upon reading the following detailed description in conjunction with the preferred embodiment of the invention illustrated in the attached drawings.

While the present invention is described in conjunction with a preferred embodiment, it will be understood that it is not intended to be limited to that embodiment only but rather to cover all alternatives, modifications and equivalents as may reasonably by included within the scope of this invention as described in the appended claims.

BRIEF DESCRIPTION OF THE DRAWINGS

In the accompanying drawings, in which is shown one of the various possible embodiments of the invention.

Figure 1:
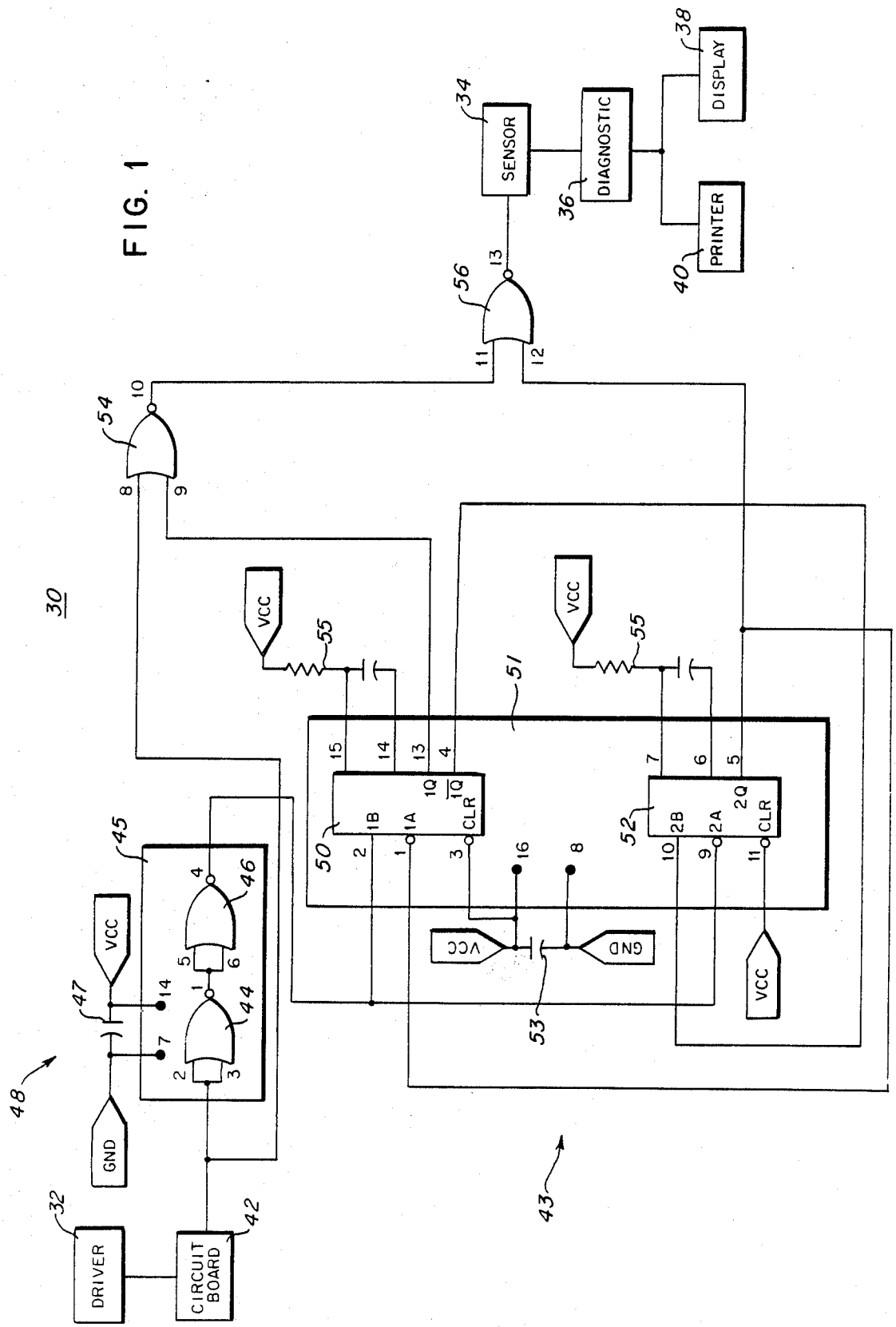
FIG. 1 is a schematic showing of a sense and hold circuit employed with a circuit test assembly.

Referring now to the drawings, particularly FIG. 1, there is shown, in a preferred embodiment of the invention, a test assembly 30 which includes a driver circuit 32 and a sensor circuit 34, the output of the sensor circuit 34 passing through a diagnostic circuit 36 which interprets the results of the test operation and displays the results on a visual display 38 such as an a light emitting diode display, and for a more permanent record, on the output of a printer 40. The test assembly 30 also includes a keyboard (not shown) for entering test instructions to initiate a test program specific to the unit to be tested. The driver circuit 32 provides a signal or test pulse to a logic circuit to be tested, shown as a circuit board 42.

It has been observed that available test assemblies include sensor circuits which, because of other design requirements, are unable to sense short duration pulses on the order of pulses less than 500 nanoseconds in duration. In a number of test applications, the logic circuits to be tested have output pulses substantially less than 500 nanoseconds in width, for example, as little as 40 nanoseconds and thus cannot be tested for operability by a test assembly such as 30. This necessitates disassembly of the unit under test and forwarding to a central test facility for further testing, thereby greatly increasing the length of time the unit is out of service.

According to the present invention, there is provided, either as a modification to a test assembly 30, or as a separate unit such as a plugging circuit board, a sense and hold circuit, shown generally at 43, which is capable of sensing short duration pulses, for example, down to 40 nanoseconds in width, and holding such pulses for a sufficient time so that they can be detected by providing a pulse to the sensor circuit 34 which has a duration in excess of the minimum threshold width acceptable to sensing circuit 34, for example, greater than 500 nanoseconds.

Sense and hold circuit 43 forms a part of test assembly 30 and is interconnected between circuit board 42 under test and sensor 34. The output pulse from circuit board 42 in response to a stimulus pulse from driver circuit 32 is fed to a pair of NOR gates 44 and 46 whose output is fed to a pair of monostable multivibrators 50 and 52. The output of circuit board 42 and the output of multivibrator 50 are connected through NOR gate 54 to gate 56 and the output of multivibrator 52 and NOR gate 54 are connected through NOR gate 56 to sensor circuit 34.

NOR gates 44 and 46 are contained in a package 45 which includes a filter capacitor 47 to filter spurious signals as part of a power supply 48 through input pins 7 and 14. Monstable multivibrators 50 and 52 are contained in package 51 which includes a decoupling capacitor 53 which in similar fashion to 47, filters spurious signals. The NOR gates 44 and 46 operate as a buffer 45 to prevent false triggering of the monostable multivibrators 50 and 52. For example when VCC is +5 volts the buffer 45 will not pass any pulse less than +2 volts as a high or positive pulse. Timing resistors and capacitors 55 determine the width of the output pulse for the monostable multivibrators 50 and 52 as explained further in the description.

Figure 2:
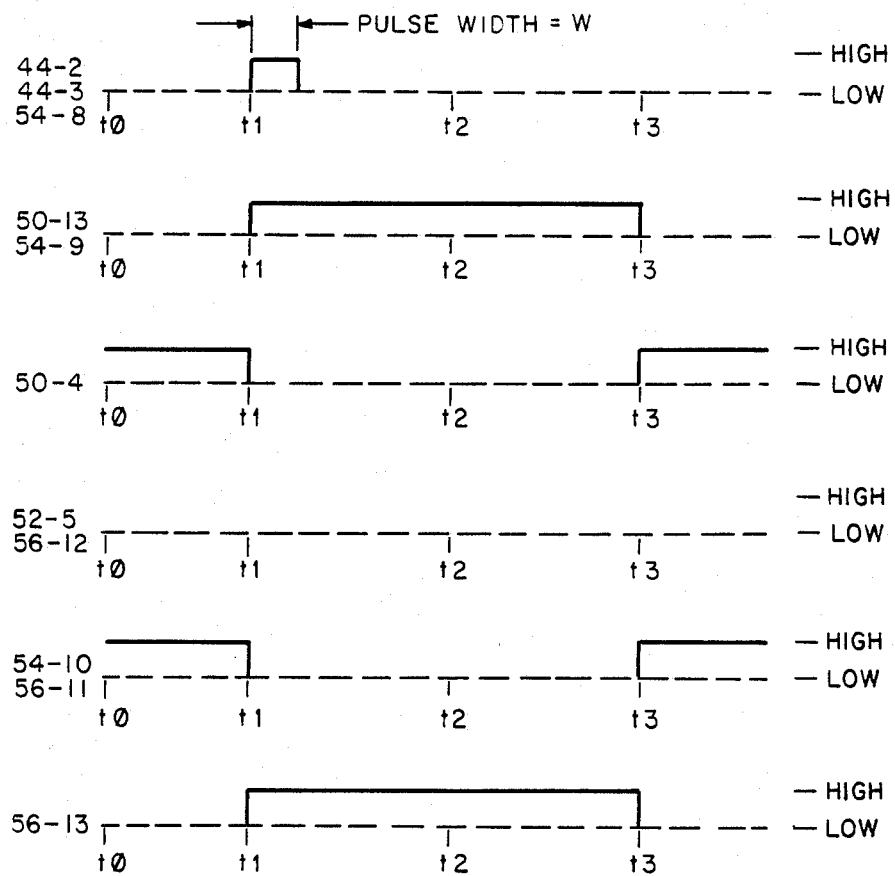
FIG. 2 is a timing diagram illustrating the state of the circuit at different points and times where the input is a positive pulse.
Figure 3:
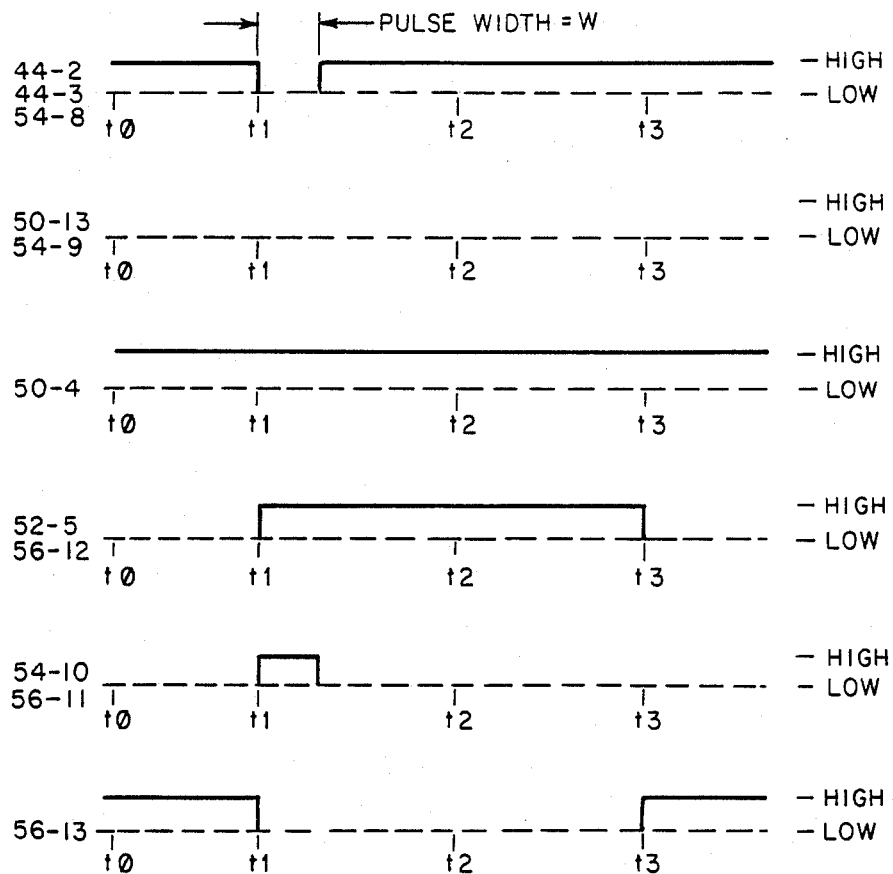
FIG. 3 is a timing diagram illustrating the state of the circuit at different points and times when the input is a negative pulse.

Referring to FIGS. 2 and 3, there are shown timing diagrams indicating the state of the sense and hold circuit 43 at different points in the circuit and at different times in the sequence of operation. FIG. 2 shows the status when the input pulse (output from circuit board 42) to circuit 43 is a positive pulse and FIG. 3 shows the status when the input pulse is a negative pulse.

Time t0 is a time prior to providing a stimulus test pulse to circuit board under test 42 from driver 32. Time t1 is the time at which driver circuit 32 supplies a pulse to the unit under test 42 and time t2 is a time during the period when the circuit board 42 is being tested to determine the effect of the pulses supplied by circuit 32. Time t3 is the time-out or period of activation of the multivibrators when T =KRC. The values R and C of the timing resistors and capacitors 55 are selected so that, together with the inherent value K, the multivibrator multiplying factor, the duration or width T of the input signal to sensor circuit 34 is greater than threshold width capable of being sensed by circuit 34. The duration time T=KRC and also is equal to the interval from t1 to t3.

In FIGS. 2 and 3, there is shown the state of the circuit at various points and times. On the left hand column, the various points in the circuit are indicated by the circuit element number followed by the input (or output) line (or pin connection) for that circuit element. In the top line of FIG. 2, a positive pulse of duration W where W is of relatively short duration and less the threshold width acceptable by sensor circuit 34, is output from unit 12 as a result of a stimulus pulse from driver 32. The width W is determined by the nature of the element 42 under test. The pulse of short duration W appears at input lines 2 and 3 of NOR gate 44 and line 8 of gate 54. Multivibrator 50 is enabled at t1 thereby providing a high signal through output 13 to input 9 of gate 54. Multivibrator 52 is disabled from line 4 of multivibrator 50 thereby providing a low signal to input 12 of gate 56. Since input 11 of gate 56 is taken from output 10 of gate 54, a high signal or pulse is provided to sensor 34 through output 13. The duration or width of the pulse at 56-13 is determined by the value of the resistors and capacitors at 53 as noted.

As shown in FIG. 3, when a negative pulse of short duration W is received from circuit board 42 being tested, multivibrator 52 is enabled and multivibrator 50 is disabled, thus providing a low signal to gate 54 through input 9 and multivibrator 52 provides a high signal to input 12 of gate 56. Gate 54 provides a low to input 11 of gate 56 and thus, a low pulse of duration from t1 to t3 is provided to sensor 34 from output 13 of gate 56. It should be noted that the trailing edge of the short duration pulse, whether high or low, does not inhibit the output of a pulse of suitable duration or width T through gate 56.

As can be seen from the foregoing description, a sense and hold circuit 43 for use in logic circuit testing has been provided which provides a pulse of long duration as great or greater than the threshold width necessary to activate a sensor circuit.

In a one embodiment of this invention, the test assembly was a Model 2225 Portable Service Processor available from GenRad of Waltham, Mass. The multivibrator package 51 was a part number 54123 available from Texas Instruments, Incorporated of Dallas, Tex., while the NOR gate package 45 was a part number 54LS02, also available from Texas Instruments. The value of R and C were selected to be 47K ohms and 1000 picofarads, respectively.

It can be seen that the objects of the invention set forth above are achieved by the embodiment of the invention described. It is understood that the subject matter described herein is to be interpreted as illustrative of the invention.

What is claimed is:

1. A test assembly for testing digital circuit elements including a driver circuit for supplying a stimulus pulse to the circuit element to be tested; a sensor circuit for detecting the signal output of the circuit element in response to the stimulus pulse, the sensor circuit having a minimum threshold period below which signal pulses of shorter duration are undetected by the sensor circuit; and a sense and hold circuit connected to the driver circuit, the sensor circuit and the circuit element being tested, the sense and hold circuit having means for detecting a first signal pulse output from the circuit element in response to the stimulus pulse and means for providing a second signal pulse to the sensor circuit in response to the first signal pulse, the second signal pulse having a duration at least as great as the minimum threshold period detectable by the sensor circuit.

2. A test assembly as set forth in claim 1 wherein the means for detecting the first signal pulse is a monostable multivibrator.

3. A test assembly as set forth in claim 2 wherein the sense and hold circuit includes a resistance having a value R and a capacitance having a value C, and wherein the duration of the second signal pulse is a function of the product of R and C.

4. A test assembly as set forth in claim 3 wherein the means providing the second signal includes a NOR gate, one of whose input lines is connected to the output of the multivibrator.

5. A test assembly as set forth in claim 4 wherein the sensor circuit includes a diagnostic circuit for comparing the signal received by the sensor circuit to a predicted signal to determine the operability of the circuit element.

6. A test assembly as set forth in claim 5 wherein the sense and hold circuit includes a pair of NOR gates through which the signal from the circuit element is directed, the NOR gates being selected to pass only signals above a minimum threshold amplitude.

7. A sense and hold circuit for use in combination with a test assembly for testing digital circuits which includes a driver circuit for supplying a stimulus pulse to the circuit element to be tested and which further includes a sensor circuit for detecting the signal output of the circuit element in response to stimulus pulse, the sensor circuit having a minimum threshold period below which signal pulses of shorter duration are undetected by the sensor circuit, comprising means for connecting the sense and hold circuit to the output of the circuit element and the input of the sensor circuit, means for detecting a first signal pulse output from the circuit element in response to the stimulus pulse and means for providing a second signal pulse to the sensor circuit in response to the first signal pulse, the second signal pulse having a duration at lease as great as the minimum threshold period detectable by the sensor circuit.

8. A sense and hold circuit as set forth in claim 7 wherein the means for detecting the first signal pulse is a monostable multivibrator.

9. A sense and hold circuit as set forth in claim 8 wherein the sense and hold circuit includes a resistance having a value R and a capacitance having a value C, and wherein the duration of the second signal pulse is a function of the product of R and C.

10. A sense and hold circuit as set forth in claim 9 wherein the means providing the second signal includes a NOR gate, one of whose input lines is connected to the output of the multivibrator.

11. A sense and hold circuit as set forth in claim 10 wherein the sense and hold circuit includes a pair of NOR gates through which the signal from the circuit element is directed, the NOR gates being selected to pass only signals above a minimum threshold amplitude.

12. A method of testing a digital circuit element comprising the steps of supplying a stimulus pulse to the element to be tested to produce a first output signal pulse; directing the first output pulse through a multivibrator circuit having a resistance R and a capacitance C to produce a second signal pulse having a duration which is a product of R and C; directing the second signal pulse to a sensor circuit having a minimum threshold period below which signals are not detected, the values of R and C being selected so that the duration of the second signal pulse is greater than the minimum threshold of the sensor circuit; and comparing the second signal pulse with a predicted signal pulse to determine the operability of the circuit element.

* * * * *